United States Patent
Bae et al.

(10) Patent No.: US 9,894,792 B2
(45) Date of Patent: Feb. 13, 2018

(54) DISPLAY PANEL, ELECTRONIC DEVICE INCLUDING THE SAME, AND BONDING METHOD THEREOF

(71) Applicant: SAMSUNG DISPLAY CO., LTD., Yongin, Gyeonggi-Do (KR)

(72) Inventors: Han Sung Bae, Yongin (KR); Won Kyu Kwak, Yongin (KR)

(73) Assignee: SAMSUNG DISPLAY CO., LTD., Yongin, Gyeonggi-do (KR)

(*) Notice: Subject to any disclaimer, the term of this patent is extended or adjusted under 35 U.S.C. 154(b) by 1034 days.

(21) Appl. No.: 14/048,213

(22) Filed: Oct. 8, 2013

(65) Prior Publication Data

US 2014/0321088 A1 Oct. 30, 2014

(30) Foreign Application Priority Data

Apr. 29, 2013 (KR) .......................... 10-2013-0047535

(51) Int. Cl.
*H05K 1/00* (2006.01)
*G02F 1/1345* (2006.01)
(Continued)

(52) U.S. Cl.
CPC ........... *H05K 7/06* (2013.01); *G02F 1/13458* (2013.01); *H05K 1/117* (2013.01);
(Continued)

(58) Field of Classification Search
CPC ............ H01L 2224/50; H01L 2224/79; H01L 2224/86; H01L 2225/06579; H01L 2225/107; H01L 23/49572; H01L 24/50; G02F 1/13458; B23K 2201/42; H05K 2201/10681
(Continued)

(56) References Cited

U.S. PATENT DOCUMENTS 5,951,304 A * 9/1999 Wildes .................. B81B 7/0006
174/261
6,172,732 B1 1/2001 Hayakawa et al.
(Continued)

FOREIGN PATENT DOCUMENTS

CN 1268675 A 10/2000
CN 1441288 A 9/2003
(Continued)

OTHER PUBLICATIONS

European Search Report dated Sep. 27, 2016.

*Primary Examiner* — Binh Tran
(74) *Attorney, Agent, or Firm* — Lee & Morse, P.C.

(57) ABSTRACT

A display panel includes a display configured to display an image by receiving a drive signal, and a pad region including first and second pads groups configured to receive the drive signal from an external and to provide the received drive signal to the display, wherein the first pad group includes a plurality of first pads extending along a plurality of first imaginary lines, wherein the second pad group includes a plurality of second pads extending along a plurality of second imaginary lines, and wherein the plurality of first imaginary lines converges into a first point and the plurality of second imaginary lines converges into a second point, the first point and the second point are located at different positions.

20 Claims, 14 Drawing Sheets

(51) Int. Cl.
*H05K 7/06* (2006.01)
*H05K 1/11* (2006.01)
*H01L 23/00* (2006.01)
*H01L 23/495* (2006.01)
*H05K 3/36* (2006.01)

(52) U.S. Cl.
CPC ........ *H01L 23/49572* (2013.01); *H01L 24/50* (2013.01); *H01L 2224/50* (2013.01); *H01L 2224/79* (2013.01); *H01L 2224/86* (2013.01); *H01L 2225/06579* (2013.01); *H01L 2225/107* (2013.01); *H05K 1/118* (2013.01); *H05K 3/361* (2013.01); *H05K 2201/094* (2013.01); *H05K 2201/09418* (2013.01); *H05K 2201/10128* (2013.01); *H05K 2201/10681* (2013.01)

(58) Field of Classification Search
USPC ....... 345/55, 87; 349/149–152, 139; 159/64; 228/179.1, 180.1, 180.21, 180.22; 361/749; 439/65; 257/E23.065, E23.07
See application file for complete search history.

(56) References Cited

U.S. PATENT DOCUMENTS

| | | |
|---|---|---|
| 2003/0160929 A1 | 8/2003 | Kurasawa |
| 2006/0049494 A1* | 3/2006 | Urushido .......... H01L 23/49838 257/666 |
| 2007/0029658 A1 | 2/2007 | Peng et al. |
| 2007/0195763 A1 | 8/2007 | Onodera |
| 2007/0275578 A1 | 11/2007 | Yamada |
| 2012/0134120 A1 | 5/2012 | Gondo |
| 2013/0141877 A1 | 6/2013 | Lau et al. |

FOREIGN PATENT DOCUMENTS

| | | |
|---|---|---|
| EP | 0588481 A1 | 3/1994 |
| EP | 2811337 A1 | 12/2014 |
| JP | 2000-269608 A | 9/2000 |
| JP | 2003-258027 A | 9/2003 |
| JP | 2007-242942 A | 9/2007 |
| KR | 10-0299390 B1 | 6/2001 |
| KR | 10-0856640 B1 | 8/2008 |
| WO | WO 2013/128857 A1 | 9/2013 |

* cited by examiner

DISPLAY PANEL, ELECTRONIC DEVICE INCLUDING THE SAME, AND BONDING METHOD THEREOF

CROSS-REFERENCE TO RELATED APPLICATION

The present application claims priority under 35 U.S.C. § 119 to Korean Patent Application No. 10-2013-0047535, filed on Apr. 29, 2013, in the Korean Intellectual Property Office, and entitled: "Display Panel, Electronic Device Including the Same, and Bonding Method Thereof," which is incorporated by reference herein in its entirety.

BACKGROUND

1. Field

Example embodiments disclosed herein relate to a display panel, an electronic device including the same, and a bonding method thereof. More particularly, example embodiments relate to a display panel capable of improving bonding reliability, an electronic device including the display panel, and a bonding method of the electronic device.

2. Description of the Related Art

In general, an electro-optical device mounted in an electronic device, e.g., a mobile phone, a notebook computer, or a TV, may include an electro-optical panel, e.g., a liquid crystal display panel, and a flexible wiring substrate mounted on the electro-optical panel. When a driver circuit driving the electro-optical panel is formed on the electro-optical panel, the flexible wiring substrate supplies display data or control signals to the electro-optical panel. When the driver circuit is not formed on the electro-optical panel, it may be mounted on the flexible wiring substrate or on an additional circuit substrate connected to the flexible wiring substrate, so the flexible wiring board supplies a driving signal output from the driver circuit to the electro-optical panel. The electro-optical panel may include a plurality of input pads in order to be electrically connected to the flexible wiring substrate, and the flexible wiring substrate includes a plurality of output pads corresponding to the plurality of input pads.

SUMMARY

Example embodiments provide a display panel capable of improving bonding reliability with a flexible wiring substrate.

Example embodiments also provide an electronic device including a display panel and a flexible wiring substrate capable of improving the bonding reliability thereof.

Example embodiments also provide a bonding method of an electronic device capable of improving the bonding reliability of a display panel and a flexible wiring substrate.

Embodiments provide a pad region receiving a drive signal from external, and a display region connected to the pad region to display an image by receiving the drive signal. The pad region includes a first pad group and a second pad group. The first pad group includes a plurality of first pads extending along a plurality of first imaginary lines, and the second pad group includes a plurality of second pads extending along a plurality of second imaginary lines. The plurality of first imaginary lines substantially converges into a first point and the plurality of second imaginary lines substantially converges into a second point, the first point and the second point being located at different positions.

First angles between first respective reference axes, each parallel to a reference line, and the plurality of first imaginary lines may decrease with approaching the reference line. Second angles between second respective reference axes respectively parallel to the reference line and the plurality of second imaginary lines may decrease with approaching the reference line.

The first angles decrease by a first value and the second angles decrease by a second value, and the first value and the second value may be the same or different.

When an angle between a first reference axis of the first respective reference axes and a first outermost line among the plurality of first imaginary lines relative to the reference line is $\theta 11$, an angle $\theta 1n$ between a first imaginary line parallel to an n-th pad of the first pad group and an n-th reference axis of the first respective reference axes may satisfy the following equation, $\theta 1n = \theta 11 - (n-1)\alpha$, where n is an integer greater than or equal to 2, and $\alpha$ is the first value.

When an angle between a first reference axis of the second respective reference axes and a second outermost line located at the outermost among the plurality of second imaginary lines relative to the reference line is $\theta 21$, an angle between a second imaginary line parallel to an m-th pad of the second pad group and an m-th reference axis of the second respective reference axes may satisfy the following equation, $\theta 2m = \theta 21 - (m-1)\beta$, where m is an integer greater than or equal to 2 and a number of the second pads, and $\beta$ is the second value.

When $\theta 21 < \theta 11$, $\theta 21$ may satisfy the following equation, $\theta_{21} \neq \theta 11 - n \times \alpha$.

The first point and the second point may be located at different positions on the reference line.

One of the first point and the second point may be located on the reference line and the other is located outside the reference line.

The first pads and the second pads may be spaced apart from each other along a first direction, the reference line may be parallel to a second direction orthogonal to the first direction, and the pad region may further include a third pad group and a fourth pad group symmetric to the first pad group and the second pad group, respectively, with respect to the reference line.

Each of the first pads and the second pads may have a parallelogram form having two first sides parallel to the first direction and two second sides tilted with respect to the reference line, an interval between two adjacent pads in the first direction is not constant.

Embodiments also provide an electronic device, including first and second electronic components electrically connected to each other, each of the first and second electronic components including a pad region, and each pad region having a first pad group and a second pad group, wherein the first pad group includes a plurality of first pads extending along a plurality of first imaginary lines, wherein the second pad group includes a plurality of second pads extending along a plurality of second imaginary lines, and wherein the plurality of first imaginary lines converges into a first point and the plurality of second imaginary lines converges into a second point, the first point and the second point being located at different positions.

The first pads and the second pads may be spaced apart from each other along a first direction and the reference line may be parallel to a second direction orthogonal to the first direction. First angles between first respective reference axes each parallel to a reference line and the plurality of first imaginary lines may decrease with approaching the reference line. Second angles between second respective reference axes each parallel to the reference line and the plurality of second imaginary lines may decrease with approaching the reference line.

The first angles decrease by a first value and the second angles decrease by a second value, and the first value and the second value may be the same or different.

When an angle between a first reference axes of the first respective reference axes and a first outermost line among the plurality of first imaginary lines relative to the reference line is θ11, an angle θ1n between a first imaginary line parallel to an n-th pad of the first pad group and an n-th reference axis of the first respective reference axes may satisfy the following equation, θ1n=θ11−(n−1)α, where n is an integer greater than or equal to 2, and α is the first value.

When an angle between a first reference axis of the second respective reference axes and a second outermost line located at the outermost among the plurality of second imaginary lines relative to the reference line is θ21, an angle between a second imaginary line parallel to an m-th pad of the second pad group and an m-th reference axis of the second respective reference axes may satisfy the following equation, θ2m=θ21−(m−1)β, where m is an integer greater than or equal to 2 and a number of the second pads, and β is the second value.

When θ21<θ11, θ21 may satisfy the following equation, $\theta_{21} \neq \theta 11 - n \times \alpha$.

The first electronic component may be an electro-optical panel, and the second electronic component may be a flexible wiring substrate supplying a drive signal to the electro-optical panel.

The first and the second points may be located on the electro-optical panel.

The first and second points may be located on the flexible wiring substrate.

Embodiments also provide a method of bonding a first electronic component and a second electronic component of an electronic device, the first electronic component and the second electronic being electrically coupled to each other, each of the first electronic component and the second electronic component including a pad region, and each pad region having a first pad group and a second pad group, the first pad group includes a plurality of first pads extending along a plurality of first imaginary lines, the second pad group includes a plurality of second pads extending along a plurality of second imaginary lines, and the plurality of first imaginary lines converges into a first point and the plurality of second imaginary lines converges into a second point, the first point and the second point being located at different positions. The method includes performing primary alignment of the first electronic component and second electronic component, such that the first electronic component and the second electronic component face each other, calculating a first x-axis displacement value of the first electronic component and a second x-axis displacement value of the second electronic component, determining whether the first and second x-axis displacement values are different from each other, when the first and second x-axis displacement values are the same, proceeding to bonding the first electronic component and the second electronic component, and when the first and second x-axis displacement values are different, calculating a y-axis correction value on the basis of a deviation between the first and second x-axis displacement values, and correcting the first electronic component and the second electronic components by a y-axis on the basis of the calculated y-axis correction value.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
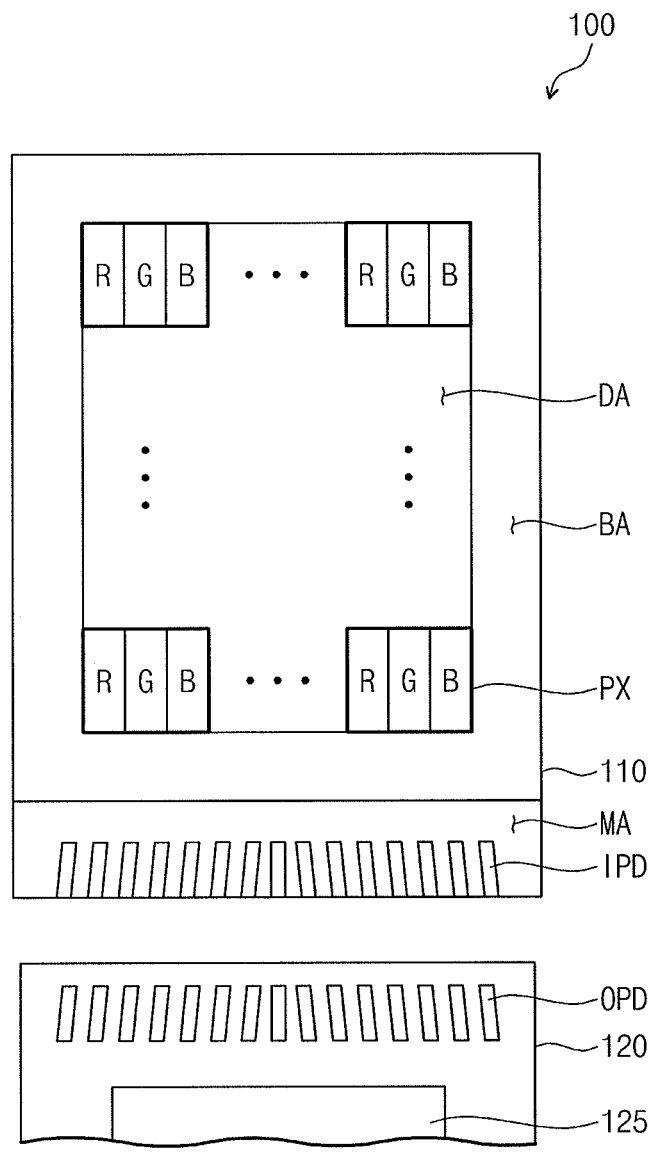
FIGS. 1 and 2 illustrate plan views of a bonding process of a display panel and a flexible wiring substrate in an electro-optical device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Like reference numerals refer to like elements. In the drawings, the thicknesses of layers and regions may be exaggerated for clarity. Also, though terms like a first and a second are used to describe various members, components, regions, layers, and/or portions in various embodiments, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment can be referred to as a second member, a second component, a second region, a second layer, or a second portion in another embodiment. The terms of a singular form may include plural forms unless referred to the contrary.

The meaning of "include," "comprise," "including," or "comprising," specifies a property, a region, a fixed number, a step, a process, an element and/or a component but does not exclude other properties, regions, fixed numbers, steps, processes, elements and/or components. In the drawings, the dimensions of layers and regions are exaggerated for clarity of illustration.

It will also be understood that when a layer (or element) is referred to as being 'on' another layer, element, or substrate, it can be directly on the other layer, element, or substrate, or intervening layers may also be present. Further, it will be understood that when a layer is referred to as being 'under' another layer, it can be directly under, or one or more intervening layers may also be present. In addition, it will also be understood that when a layer is referred to as being 'between' two layers, it can be the only layer between the two layers, or one or more intervening layers may also be present.

Hereinafter, exemplary embodiments will be described in conjunction with the accompanying drawings.

Figure 2:
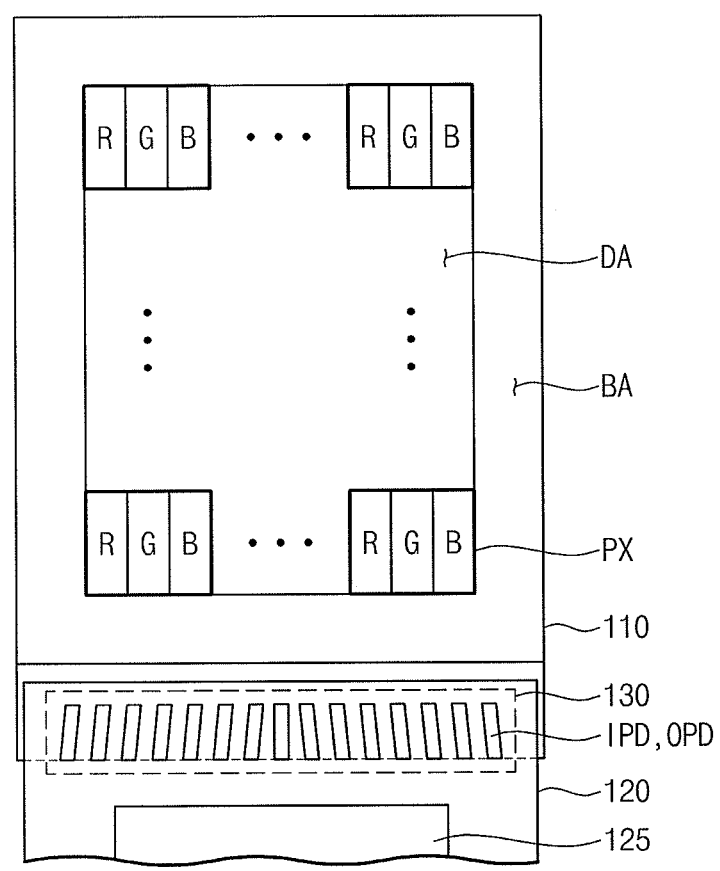

FIGS. 1 and 2 illustrate plan views of stages in a bonding process of a display panel and a flexible wiring substrate in an electro-optical device according to an embodiment.

Referring to FIG. 1, an electro-optical device 100 may include an electro-optical panel 110 and a flexible wiring substrate 120 attached to the electro-optical panel 110. The electro-optical panel 110 may be a display panel displaying a desired image by applying a drive signal to an electro-optical material equipped therein. Depending on a kind of the electro-optical material, the electro-optical panel 110 may include, e.g., a liquid crystal display panel, an organic electroluminescence display panel, an electro-wetting display panel, etc.

The electro-optical panel 110 (hereinafter, referred to as a display panel) may include a display area DA equipped with a plurality of pixels PX, a black matrix area BA surrounding the display area DA, and a mounting area MA to which the flexible wiring substrate 120 is attached. The display area DA is an area where the plurality of pixels PX is arranged in a matrix and an image is substantially displayed. According to an embodiment, each pixel PX may include first to third sub pixels R, G, and B to realize red, green, and blue colors, respectively. The black matrix area BA is an area where a black matrix (not shown) blocking light is formed. According to an embodiment, a gate driver circuit (not shown) for supplying a gate signal to the pixels PX may be provided in the black matrix area BA.

The mounting area MA may include input pads IPD to receive a signal supplied from the flexible wiring substrate 120. When a data driver circuit (not shown) supplying a data signal to the pixels PX is mounted on the display panel 110 in the form of a chip, the input pads IPD may be pads for supplying display data and a control signal to the data driver circuit. When the data driver circuit is mounted on the flexible wiring substrate 120 in the form of a chip, the input pads IPD may include a data pad electrically connected to data lines supplying a data signal to the pixels PX and a control signal pad electrically connected to control signal wires supplying a control signal to the data driver circuit.

As shown in FIG. 1, output pads OPD to be electrically connected to the input pads IPD in one-to-one correspondence may be provided at a contact surface (i.e., a surface being contacted with the display panel 110) of the flexible wiring substrate 120. As further illustrated in FIG. 1, the output pads OPD are aligned with the input pads IPD. According to an embodiment, a chip on film structure, in which a data driver circuit 125 is mounted on the flexible wiring substrate 120 in the form of a chip, is shown in FIG. 1.

Next, referring to FIG. 2, the flexible wiring substrate 120 is attached to the mounting area MA of the display panel 110. For this, a conductive adhesive film 130 may be interposed between the flexible wiring substrate 120 and the display panel 110. According to an embodiment, the conductive adhesive film 130 may include an anisotropic conductive film (ACF).

When the flexible wiring substrate 120 and the display panel 110 are aligned to allow the input pads IPD and the output pads OPD to face each other, the conductive adhesive film 130, i.e., the ACF film 130, is interposed between the flexible wiring substrate 120 and the display panel 110.

Then, when a thermal pressure process, i.e., heat and pressure, is applied to the mounting area MA of the display panel 110 by a tool, corresponding pads IPD and OPD are electrically connected to each other via the ACF film 130 to complete the attachment of the flexible wiring substrate 120 to the display panel 110.

Each of the display panel 110 and the flexible wiring substrate 120 may elongate due to a temperature change during the thermal pressure process performed on the mounting area MA. However, when the display panel 110 and the flexible wiring substrate 120 are formed of materials having different rates at which they elongate, misalignment may occur between the input pads IPD and the output pads OPD. Therefore, a process for realigning the misaligned input pads IPD and the output pads OPD is required.

Figure 3:
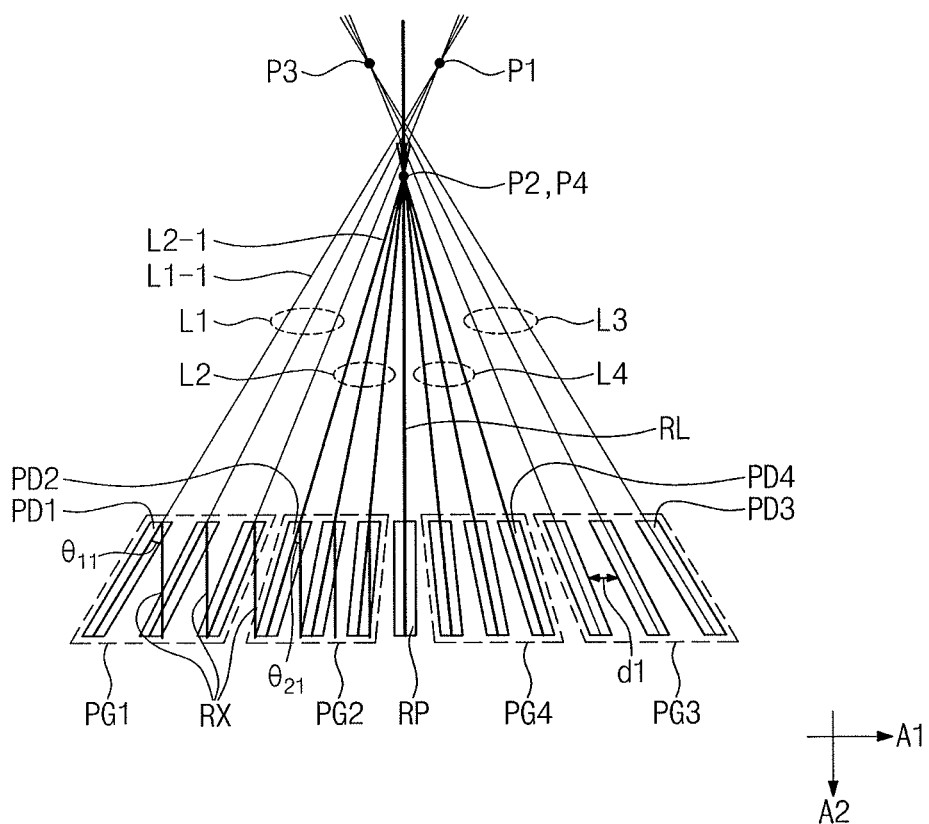
FIG. 3 illustrates a schematic plan view of input pads on the display panel of FIG. 1 according to an embodiment.

FIG. 3 illustrates a schematic view of an arrangement of input pads IPD on the display panel 110 of FIG. 1. It is noted that since the input pads IPD equipped in the display panel 110 and the output pads OPD equipped on the flexible wiring substrate 120 are provided in one-to-one correspondence (FIGS. 1-2), only a structure of the input pads IPD on the display panel 110 will be described with reference to FIG. 3. In other words, as a structure of the output pads OPD on the flexible wiring substrate 120 is substantially the same as that of the input pads IPD on the display panel 110, description of a structure of the output pads OPD will be omitted.

Referring to FIG. 3, the input pads IPD may include a plurality of pad groups, e.g., a first pad group PG1, a second pad group PG2, a third pad group PG3, and a fourth pad group PG4. For example, the first pad group PG1 and the second pad group PG2 may be provided at a left side of the display panel 110 relative to a reference line RL, and the third pad group PG3 and the fourth pad group PG4 may be provided at a right sight of the display panel 110 with respect to the reference line RL. Although two, three, or more than four pad groups may be provided, for convenience of description, a structure in which four pad groups (i.e., first through fourth pad groups PG1 through G4) are provided on the display panel 110 will be described hereinafter. Furthermore, several reference lines RL may be provided on the display panel 110, and pad groups may be disposed in a same form with respect to each reference line RL. However, for convenience of description, only one reference line RL is shown in the drawing.

The first pad group PG1 may include a plurality of first pads PD1 extending along a plurality of respective first imaginary lines L1, and the second pad group PG2 may include a plurality of second pads PD2 extending along a plurality of respective second imaginary lines L2. For example, each first pad PAD1 of the plurality of first pads PD1 may extend along, e.g., overlapping and parallel to, a corresponding first imaginary line L1. A number of the first pads PD1 in the first pad group PG1 and a number of the second pads PD2 in the second pad group PG2 may be identical to each other or different from each other.

First angles between first respective reference axes RX, each parallel to the reference line RL, and the plurality of first imaginary lines L1 decrease with approaching the reference line RL. Ratio decreasing of the first angles may be defined as a first value $\alpha$.

For example, as illustrated in FIG. 3, if the first imaginary lines L1 include three lines, a first outermost line L1-1 is the most left line in FIG. 3 and is at an angle $\theta 11$ with respect to a first reference axis of the first respective reference axes RX. Therefore, the next sequential line among the first imaginary lines L1 (the middle one of the three L1 lines) would define an angle with the reference axis RX that is different from the angle θ11 by the first value α, as will be discussed in more detail below.

Second angles between second respective reference axes RX and the plurality of second imaginary lines L2 decrease with approaching the reference line RL. Ratio decreasing of the second angles may be defined as a second value β.

The first pads PD1 and the second pads PD2 are arranged in a first direction A1, i.e., the first pads PD1 and the second pads PD2 are adjacent to each other along the first direction A1. The reference axis RX is an axis extending parallel to a second direction A2 perpendicular to the first direction A1.

When an angle between the first reference axis of the first respective reference axes RX and a first outermost line L1-1, i.e., an outermost line among the plurality of first imaginary lines L1, is θ11, an angle θ1n between a first imaginary line L1-n extending along an n-th pad of the first pad group PG1 and an n-th reference axis of the first respective reference axes RX satisfies the following Equation 1, where n is an integer greater than or equal to 2, and α is the first value discussed previously and is greater than 0.

$$\theta 1n = \theta 11 - (n-1)\alpha \qquad \text{<Equation 1>}$$

When an angle between a second reference axis of the second respective reference axes RX and a second outermost line L2-1, i.e., an outermost line among the plurality of second imaginary lines L2, is θ21, an angle θ2m between a second imaginary line L2-m extending along an m-th pad of the second pad group PG2 and an m-th reference axis of the second respective reference axes RX satisfies the following Equation 2, where m is an integer greater than or equal to 2, and β is the second value discussed previously and is greater than 0.

$$\theta 2m = \theta 21 - (m-1)\beta \qquad \text{<Equation 2>}$$

The first value α and the second value β may be identical to or different from each other. For example, if both the first pad group PG1 and the second pad group PG2 are on a same side of the reference line RL, e.g., both the first pad group PD1 and the second pad group PG2 are on the left side of the reference line RL.

Additionally, when n first pads are equipped in the first pad group PG1, the n-th pad is the last pad among first pads arranged in the first direction A1 in the first pad group PG1. The following Equation 3 is satisfied between the first pad group PG1 and the second pad group PG2.

$$\theta 21 \neq \theta_{11} - n \times \alpha, \text{ where } (\theta 21 < \theta 11) \qquad \text{<Equation 3>}$$

The second pad group PG2 is disposed closer to the reference line RL than the first pad group PG1. The angle θ21 between the second outermost line L2-1, which is parallel to the outmost pad of the second pad group PG2, and the first reference axis of the second respective reference axes RX may be smaller than the angle θ11 between the first outmost line L1-1, which is parallel to the outmost pad of the first pad group PG1, and the first reference axis of the first respective reference axes RX.

The angle θ21 is different from a value (θ11−(n×α)) obtained by subtracting the first value α from an angle θ1n between a first imaginary line, which is parallel to the n-th pad of the first pad group PG1, and the n-th reference axis of the first respective reference axes RX.

Especially, an angle θ21 between the reference axis RX and the second outermost line L2-1 of the second pad group PG2 may satisfy the following Equation 4.

$$\theta 21 < \theta 1n + \alpha, \text{where } (\theta 21 < \theta 11) \qquad \text{<Equation 4>}$$

The angle θ21 may be smaller than the value (θ11−(n×α)) obtained by subtracting the first value α from an angle θ1n between a first imaginary line L1, which is parallel to the n-th pad of the first pad group PG1, and the n-th reference axis of the first respective reference axes RX. A difference value between the angle θ21 and the angle θ1n may be defined as a third value γ, and the third value γ may be smaller than the first value α.

A center part of the display panel 110, i.e., where the reference line RL is located, has a smaller x-axis elongation (i.e., along the direction A1) than an outer part of the display panel 110, i.e., where the first imaginary lines L1 are located. However, the x-axis elongation may not linearly change from the center part to the outer part. Accordingly, in consideration of the x-axis elongation that irregularly changes according to a position, the first and second values α and β may be set differently or the first pad group PG1 and the second pad group PG2 may be disposed to satisfy the above Equation 3.

As shown in FIG. 3, the display panel 110 may further include at least one reference pad RP parallel to the reference line RL, e.g., the reference pad RP extends along and overlaps the reference line RL. The third pad group PG3 is symmetric to the first pad group PG1 with respect to the reference line RL, and the fourth pad group PG4 is symmetric to the second pad group PG2 with respect to the reference line RL.

The third pad group PG3 includes third pads PD3 extending along a plurality of third imaginary lines L3 symmetric to the first imaginary lines L1 relative to the reference line RL. The fourth pad group PG4 includes a plurality of fourth imaginary lines L4 symmetric to the second imaginary lines L2 relative to the reference line RL.

The first imaginary lines L1 converge at a first point P1 and the second imaginary lines L2 converge at a second point P2. The first point P1 and the second point P2 are located at different positions. According to an embodiment, the second point P2 may be located on the reference line RL and the first point P1 may be located outside the reference line RL.

Similarly, the third imaginary lines L3 converge at a third point P3. The third point P3 may be located at a position symmetric to the first point P1 relative to the reference line RL. The fourth imaginary lines L4 converge at a fourth point P4, which coincides with the second point P2. IN other words, the second point P2 and the fourth point P4 may be disposed at the same position on the reference line RL.

Each of the first pads PD1 has a parallelogram form extending parallel to and along the corresponding first imaginary line L1, and each of the second pads PD2 has a parallelogram form extending parallel to and along the corresponding second imaginary line L2. Accordingly, the input pads IPD of the display panel 110 may be tilted, i.e., a long axis of each parallelogram-shaped input pad IPD may be angled with respect to the reference line RL (or with respect to the reference pad RP). Additionally, pads in each pad group are spaced apart from each other and arranged in the first direction A1, and an interval d1 between two adjacent pads along the first direction A1 increases, as it progressively approaches the second direction A2. It is noted that the first through fourth imaginary lines L1 through L4 are imaginary lines used to indicate a direction of the pads.

FIGS. 4A to 4D illustrate plan views of input pad IPD arrangements according to embodiments. It is noted that in FIGS. 4A to 4D, the input pads IPD are arranged in a similar way to that described previously with reference to FIG. 3, with the exception of arranging the imaginary lines and overlapping respective input pads IPD at different angles and/or distances to have different converging points.

Figure 4A:
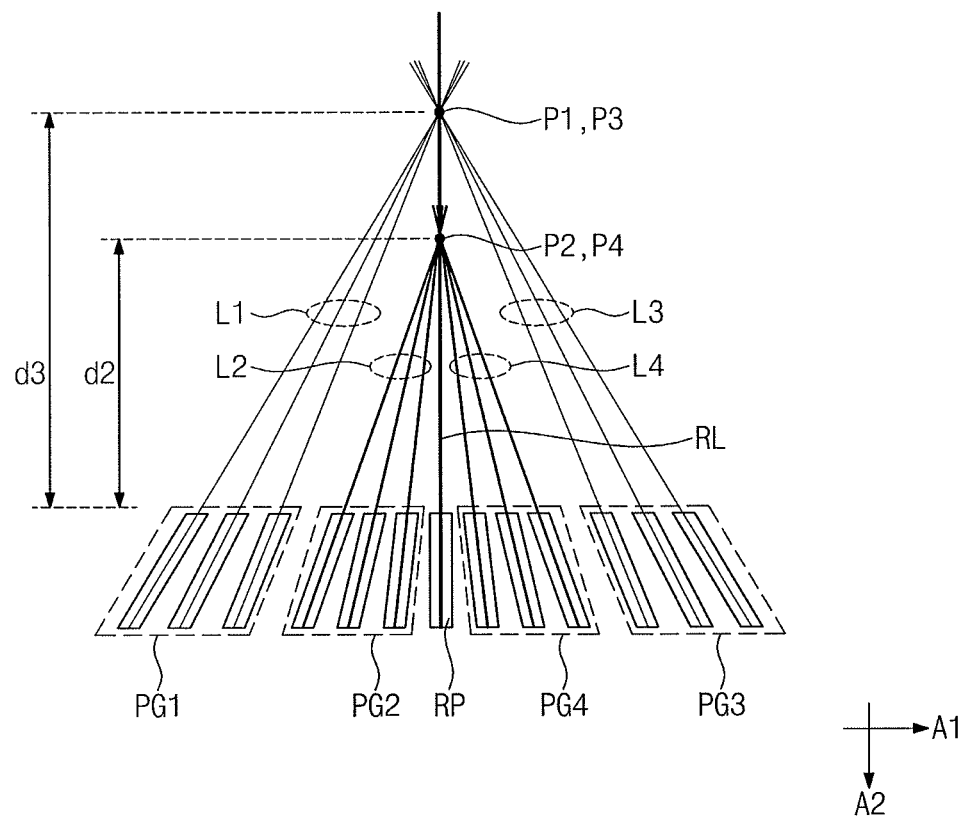
FIGS. 4A to 4D illustrate plan views of pads configuration according to embodiments.

In detail, referring to FIG. 4A, the first imaginary lines L1 parallel to the first pads PD1 of the first pad group PG1 converge at a first point P1 and the second imaginary lines L2 parallel to the second pads PD2 of the second pad group PG2 converge at a second point P2. The first point P1 and the second point P2 may be disposed at different positions on the reference line RL. The first pad group PG1 and second pad group PG2 are disposed on a line extending parallel to the first direction A1, and the second pad group PG2 may be disposed closer to the reference line RL than the first pad group PG1.

The third imaginary lines L3 converge at a third point P3, while the third point P3 and the first point P1 are disposed at the same position on the reference line RL. Additionally, the fourth imaginary lines L4 converge at a fourth point P4, while the fourth point P4 and the second point P2 are disposed at the same position on the reference line RL. The first through fourth pad groups PG1 through PG4 are disposed on the line extending parallel to the first direction A1, and the fourth pad group PG4 may be disposed closer to the reference line RL than the third pad group PG3. In addition, the first pad group PG1 has a shape symmetric to the third pad group PG3 relative to the reference line RL, and the second pad group PG2 has a shape symmetric to the fourth pad group PG4 relative to the reference line RL.

According to an embodiment, a separation distance d2 from the first and third points P1 and P3 to the reference pad RP is greater than a separation distance d3 from the second and fourth points P2 and P4 to the reference pad RP.

Figure 4B:
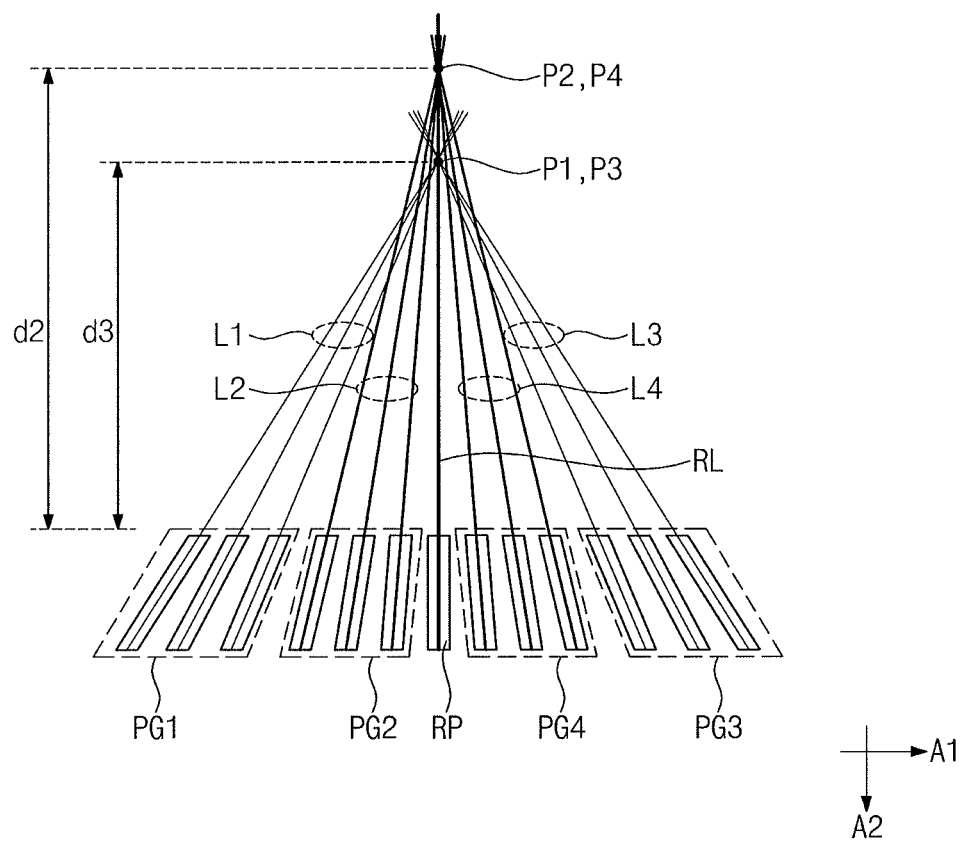

Referring to FIG. 4B, the first point P1 and the third point P3 are disposed at the same position on the reference line RL, and the second point P2 and the fourth point P4 are disposed at the same position on the reference line RL. However, according to an embodiment, the separation distance d2 from the first point P1 and the third point P3 to the reference pad RP is smaller than the separation distance d3 from the second point P2 and the fourth point P4 to the reference pad RP.

Figure 4C:
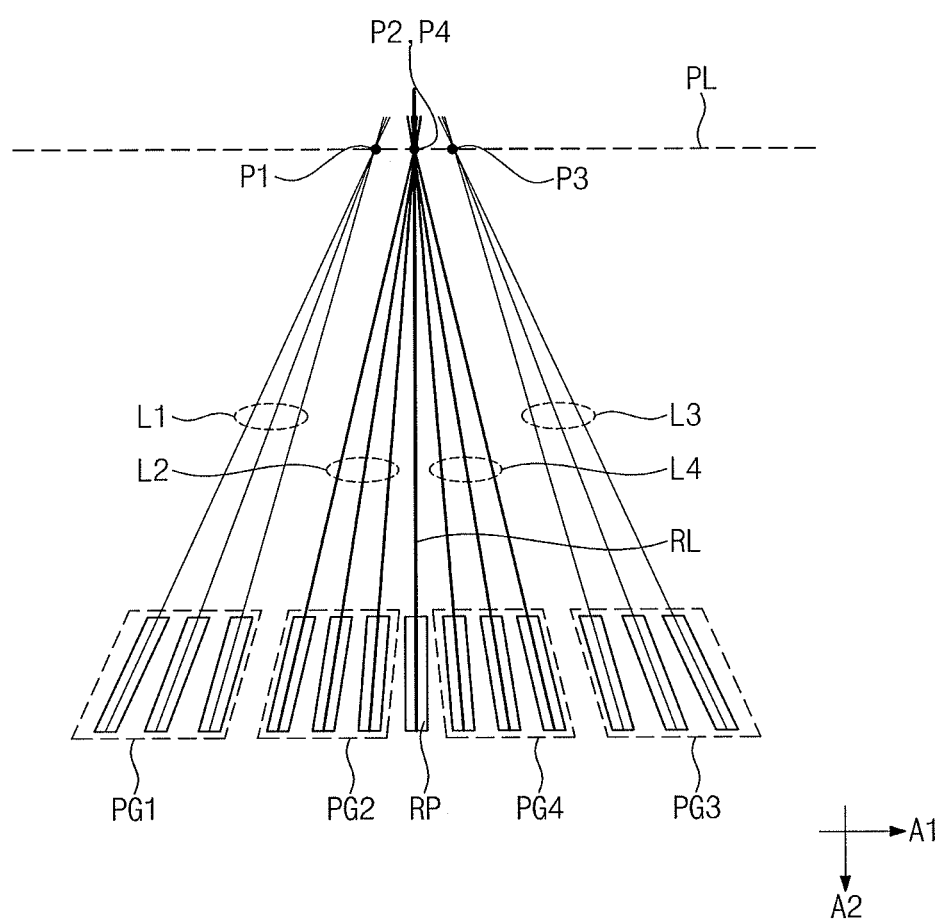

Referring to FIG. 4C, the second point P2 and the fourth point P4 are disposed at the same position on the reference line RL. The first and third points P1 and P3 are disposed on a parallel line PL perpendicular to the reference line RL and passing through the second point P2 and the fourth point P4. Additionally, the first point P1 may be located at the left relative to the reference line RL and the third point P3 may be located at the right relative to the reference line RL.

Figure 4D:
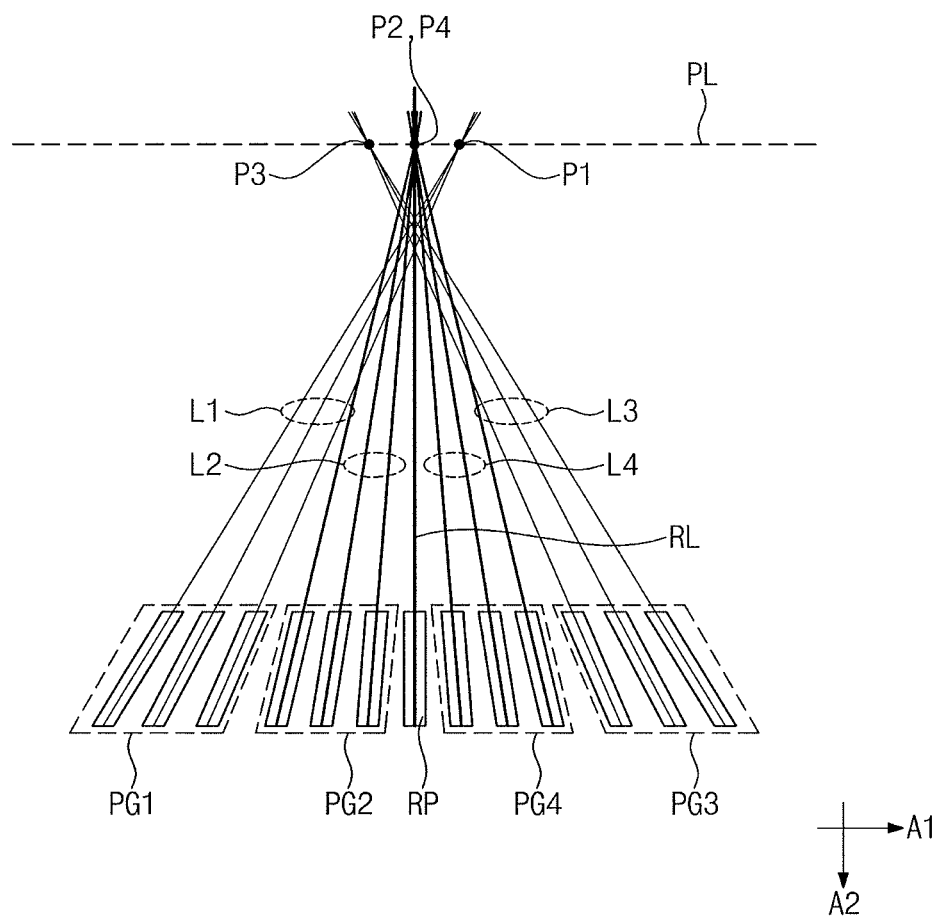

Referring to FIG. 4D, the second point P2 and the fourth point P4 are disposed at the same position on the reference line RL. The first and third points P1 and P3 are disposed on the parallel line PL perpendicular to the reference line RL and passing through the second and fourth points P2 and P4. Moreover, the first point P1 may be located at the right relative to the reference line RL, and the third point P3 may be located at the left relative to the reference line RL.

Figure 5A:
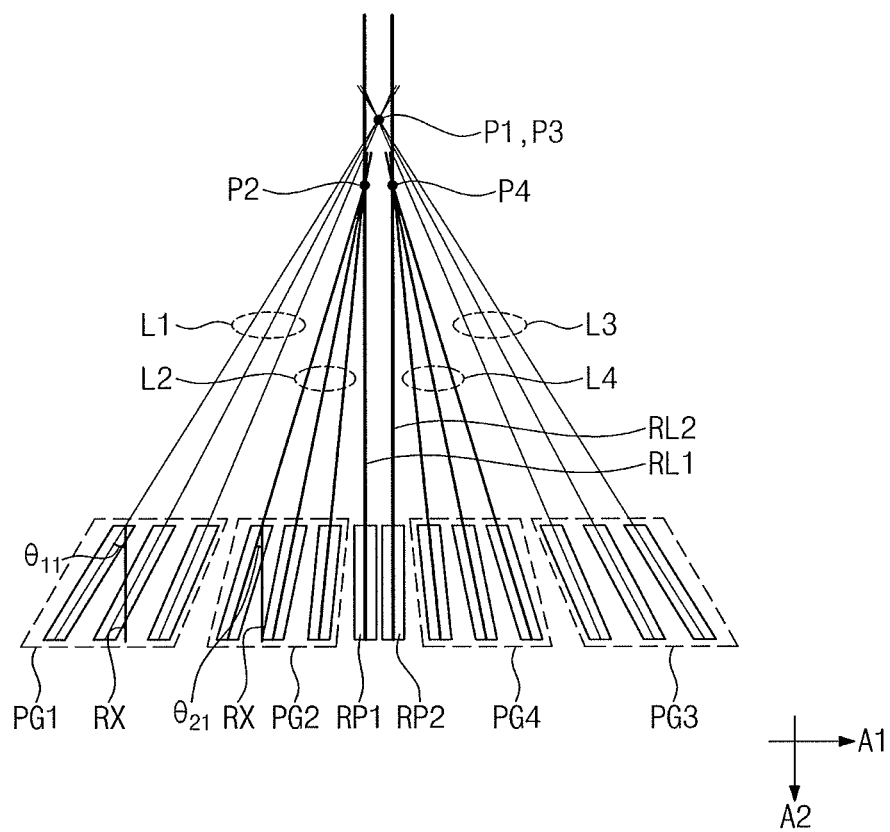
FIGS. 5A and 5B illustrate plan views of pads configuration according to embodiments.
Figure 5B:
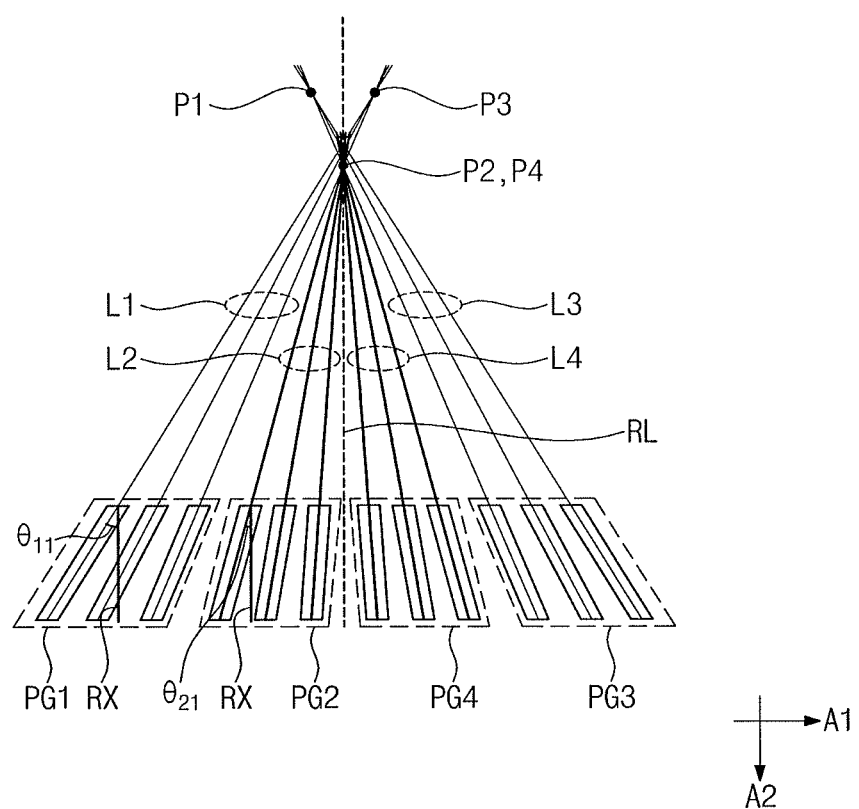

FIGS. 5A and 5B illustrate plan views of input pad IPD arrangements according to embodiments. It is noted that in FIGS. 5A to 5B, the input pads IPD are arranged in a similar way to that described previously with reference to FIG. 3, with the exception of arranging the imaginary lines and overlapping respective input pads IPD at different angles and/or distances to have different converging points.

Referring to FIG. 5A, the display panel 110 further includes a first reference pad RP1 and a second reference pad RP2 parallel to the reference axis RX. Here, a line extending along the first reference pad RP1 in parallel to the reference axis RX is referred to as a first reference line RL1 and a line extending along the second reference pad RP2 in parallel to the reference axis RX is referred to as a second reference line RL2. The second point P2, into which the second imaginary lines L2 converge, is located on the first reference line RL1, and the fourth point P4, into which the fourth imaginary lines L4 converge, is located on the second reference line RL2. Moreover, the first point P1, into which the first imaginary lines L1 converge, and the third point P3, into which the third imaginary lines L3 converge, are disposed at the same position, and the first and third points P1 and P3 may be disposed between the first reference line RL1 and the second reference line RL2.

Referring to FIG. 5B, the first pad group PG1 and the third pad group PG3 are symmetric to each other with respect to the reference line RL, which is parallel to the reference axes RX. The second pad group PG2 and the fourth pad group PG4 are symmetric to each other with respect to the reference line RL. The input pad IPD does not include a reference pad located on the reference line RL.

As shown in FIG. 5B, the reference line RL may be disposed between the second pad group PG2 and the fourth pad group PG4. Although not shown in the drawing, according to embodiments, the display panel 110 and the flexible wiring substrate 120 may have a pad form different from the pad forms of the structures of FIGS. 4A to 5B.

Figure 6:
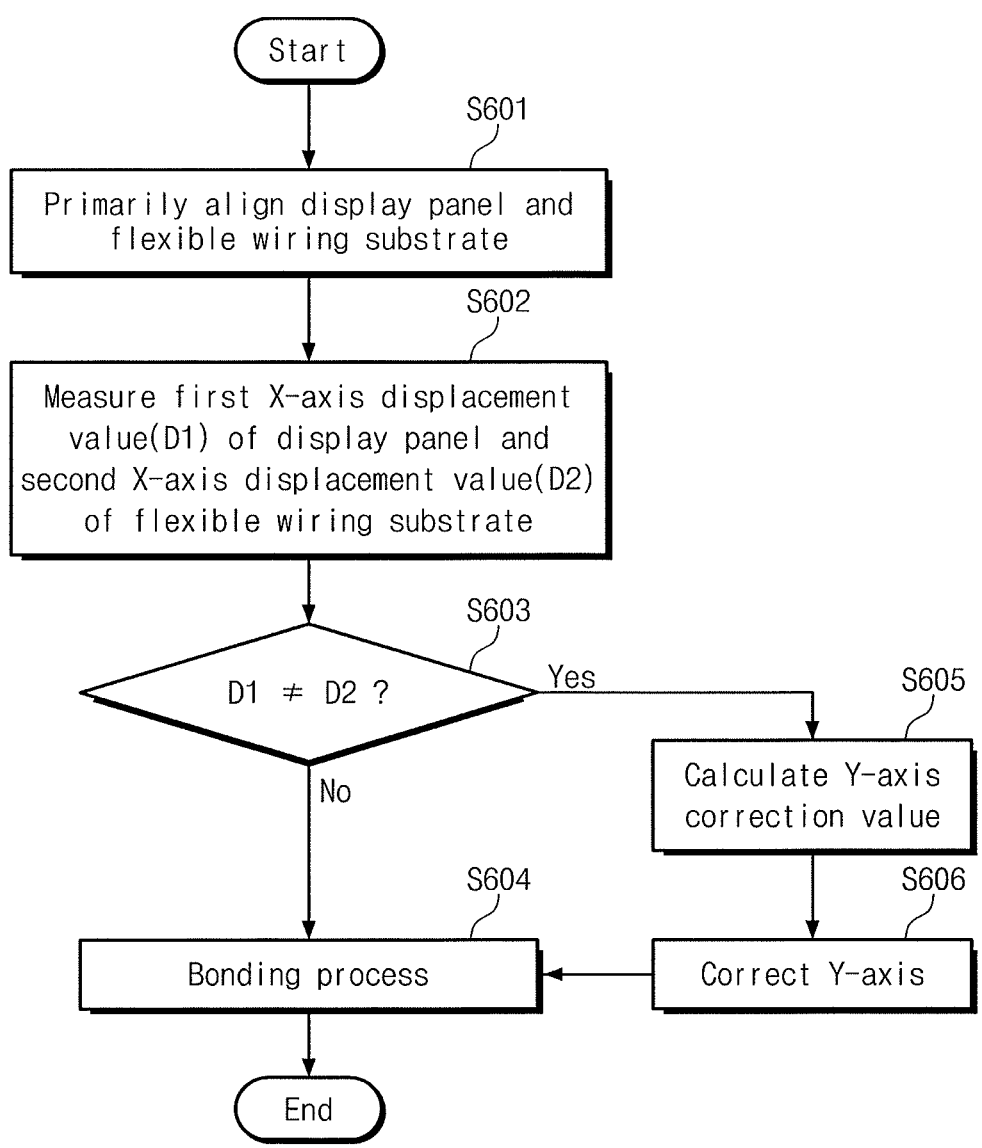
FIG. 6 illustrates a flowchart of an alignment process according to an embodiment.

FIG. 6 illustrates a flowchart of an alignment process according to an embodiment.

Referring to FIGS. 1 and 6, the display panel 110 and the flexible wiring substrate 120 are disposed to face each other in the mounting area MA to perform a primary alignment in operation S601. According to an embodiment, the primary alignment may be performed by using an align mask (not shown) to allow the pads of the display panel 110 and the pads of the flexible wiring substrate 120 to correspond to each other. Although not shown in the drawing, at least two align masks may be provided in each of the display panel 110 and the flexible wiring substrate 120.

Then, a first x-axis displacement value D1 of the display panel 110 and a second x-axis displacement value D2 of the flexible wiring substrate 120 are measured in operation S602. According to an embodiment, a distance between two align marks on the display panel 110 is measured and calculated as the first x-axis displacement value D1 and a distance between two align marks on the flexible wiring substrate 120 is measured and calculated as the second x-axis displacement value D2.

By comparing the first x-axis displacement value D1 and the second x-axis displacement value D2, it is determined whether the first x-axis displacement value D1 and the second x-axis displacement value D2 are different from each other in operation S603. When the first x-axis displacement value D1 and the second x-axis displacement value D2 are the same, the display panel 110 and the flexible wiring substrate 120 are determined as being aligned, so a bonding process is immediately performed in operation S604. However, when the first x-axis displacement value D1 and the second x-axis displacement value D2 are different from each other, the display panel 110 and the flexible wiring substrate 120 are determined as being mismatch, i.e., misaligned, so that a y-axis correction value is calculated in operation S605. However, a process of calculating the y-axis correction value is performed when a deviation between the first x-axis displacement value D1 and the second x-axis displacement value D2 is within an allowable error range.

The y-axis correction value is calculated by the following Equation 5.

$$y = x/\tan(\theta) \quad \text{<Equation 5>}$$

where y is the y-axis correction value, x is a deviation between the first x-axis displacement value D1 and the second x-axis displacement value D2, and θ is defined as an angle between a sample pad and the reference axis RX.

When the y-axis correction value is calculated by the above Equation 5, y-axis correction is performed by vertically moving one of the display panel 110 and the flexible wiring substrate 120 along the reference line RL in operation S606. When the display panel 110 and the flexible wiring substrate 120 are aligned secondarily by performing the y-axis correction, the secondarily-aligned display panel 110 and flexible wiring substrate 120 are bonded to each other in operation S604.

According to embodiments, various methods for performing a y-axis correction may be provided.

Figure 7A:
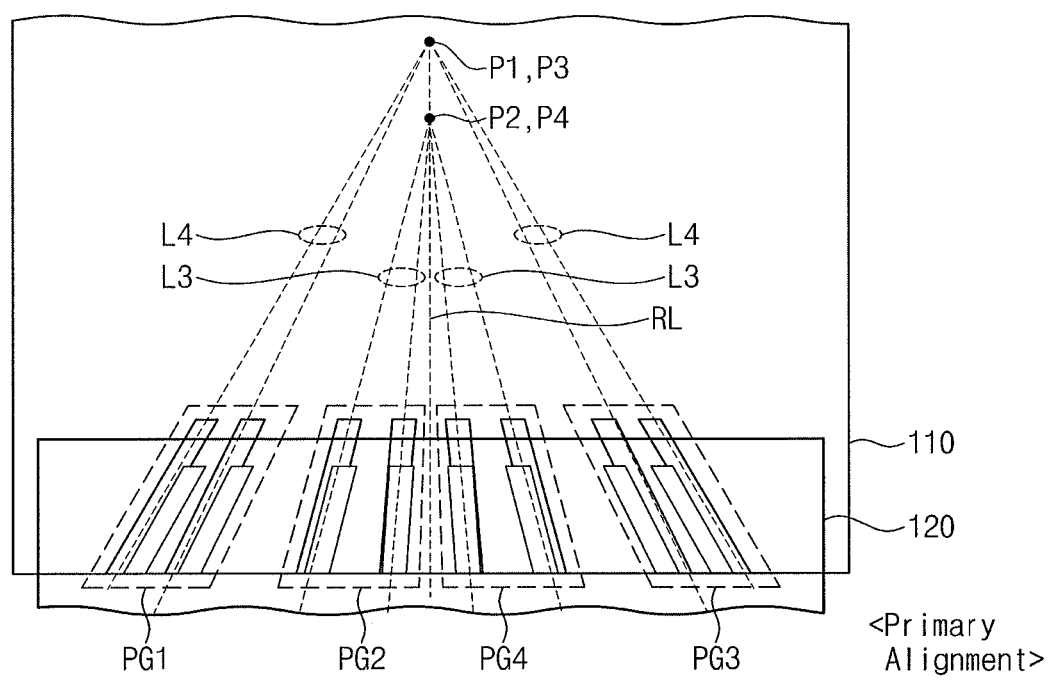
FIG. 7A illustrates a plan view of a primarily-aligned state of a display panel and a flexible wiring substrate.
Figure 7B:
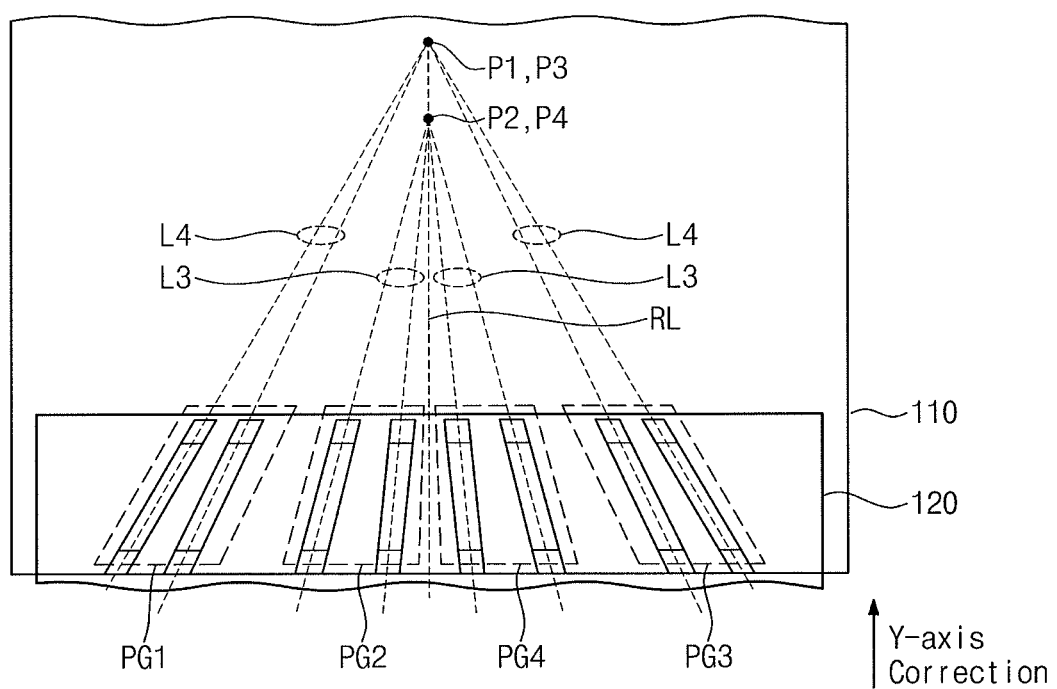
FIG. 7B illustrates a plan view of a y-axis corrected state of a display panel and a flexible wiring substrate.

FIG. 7A illustrates a plan view of a primarily-aligned state of the display panel 110 and the flexible wiring substrate 120. FIG. 7B is a plan view of a y-axis corrected state of the display panel 110 and the flexible wiring substrate 120.

Referring to FIG. 7A, the display panel 110 and the flexible wiring substrate 120 are primarily aligned to allow input pads and output pads to face each other. After the display panel 110 and the flexible wiring substrate 120 are aligned primarily, the input pads of the display panel 110 and the output pads of the flexible wiring substrate 120 may be mismatched within an allowable error range. This may occur because the display panel 110 and the flexible wiring substrate 120 have different elongations.

At this point, according to the mismatched degree, a y-axis correction value is calculated. On the basis of the calculated y-axis correction value, the positions of the display panel 110 and the flexible wiring substrate 120 may be corrected by the y-axis.

As shown in FIG. 7B, when the flexible wiring substrate 120 is y-axis corrected along the arrow direction, the mismatched input and output pads may be accurately matched.

According to a designed pad structure of FIGS. 7A and 7B, the first and third points P1 and P3, into which the first imaginary line L1 and the third imaginary line L3 converge respectively, are located at the display panel 110. The second point P2 the fourth point P4, into which the second imaginary line L2 and the fourth imaginary line L4 converge respectively, are located at the display panel 110. However, example embodiments are not limited thereto.

The y-axis correction of the flexible wiring substrate 120 may progress in a direction where the first to fourth points P1, P2, P3, and P4 are located.

Figure 8A:
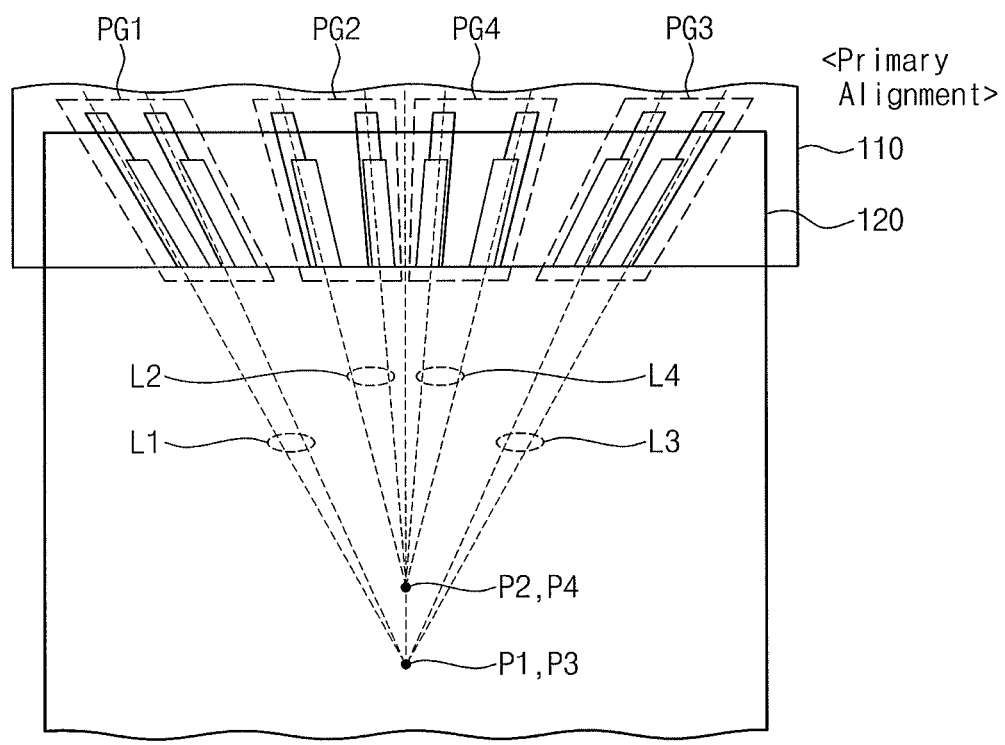
FIG. 8A illustrates a plan view of a primarily-aligned state of an electro-optical panel and a circuit substrate according to another embodiment.
Figure 8B:
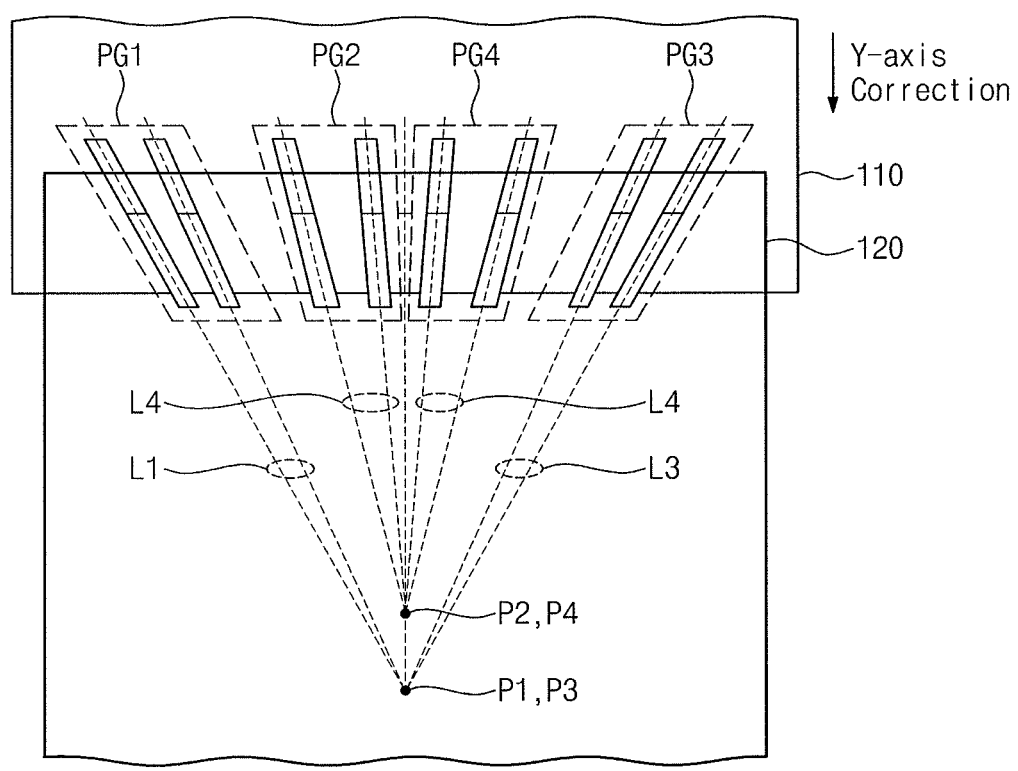
FIG. 8B illustrates a plan view of a y-axis corrected state of an electro-optical panel and a circuit substrate.

FIG. 8A illustrates a plan view of a primarily-aligned state of an electro-optical panel and a circuit substrate according to another embodiment. FIG. 8B is a plan view illustrating a y-axis corrected state of an electro-optical panel and a circuit substrate.

According to a designed pad structure of FIG. 8A, the first and third points P1 and P3, into which the first imaginary line L1 and the third imaginary line L3 converge respectively, are located at the flexible wiring substrate 120. The second point P2 and the fourth point P4, into which the second imaginary lines L2 and the fourth imaginary line L4 converge respectively, are located at the flexible wiring substrate 120.

After the display panel 110 and the flexible wiring substrate 120 are primarily aligned, if the input pads of the display panel 110 and the output pads of the flexible wiring substrate 120 are mismatched within an allowable error range, according to the mismatched degree, a y-axis correction value is calculated. On the basis of the calculated y-axis correction value, the positions of the display panel 110 and the flexible wiring substrate 120 may be corrected by the y-axis.

As shown in FIG. 8B, when the flexible wiring substrate 120 is y-axis corrected along the arrow direction, the mismatched input and output pads may be accurately matched. The y-axis correction of the flexible wiring substrate 120 may progress in a direction where the first to fourth points P1, P2, P3, and P4 are located.

According to a display panel, an electronic device including the same, and a bonding method thereof, in consideration of an x-axis elongation that changes irregularly and nonlinearly depending on a position, at least two pad groups are disposed in a pad region. Pads in the pad region are tilted at a predetermined angle on the basis of a reference line, and the convergence points of the pads are set to be at different positions for each pad group. Accordingly, when a mismatch occurs between pad regions of two electronic components to be bonded, the pad regions may be aligned through y-axis correction. As a result, bonding reliability may be improved.

In contrast, a conventional bonding process for mounting a flexible wiring substrate on an electro-optical panel may include misaligned pads of the electro-optical panel and the flexible wiring substrate due to an elongation difference between the electro-optical panel and the flexible wiring substrate, e.g., due to a temperature change or moisture. Therefore, the matching between the input pads and the output pads in the conventional bonding process may be difficult and include bonding defects.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the example embodiments as set forth in the following claims.

What is claimed is:
1. A display panel, comprising:
 a pad region receiving a drive signal from an external source; and
 a display region connected to the pad region to display an image by the received drive signal,
 wherein the pad region includes a first pad group and a second pad group adjacent to each other in a first direction,
 the first pad group includes a plurality of first pads extending along a plurality of first imaginary lines, the second pad group includes a plurality of second pads extending along a plurality of second imaginary lines, and
 wherein the plurality of the first pads and the plurality of the second pads are arrayed in the first direction,
 wherein the plurality of the first imaginary lines and the plurality of the second imaginary lines cross a reference line extending in a second direction perpendicular to the first direction, wherein one pad group of the first pad group and the second pad group is disposed between the other one pad group of the first pad group and the second pad group and the reference line in the first direction, wherein the plurality of first imaginary lines substantially converges into a first point and the plurality of second imaginary lines substantially converges into a second point, and wherein the first point and the second point are located at different positions.

2. The display panel as claimed in claim 1, wherein:

first angles between first respective reference axes, each parallel to the reference line, and the plurality of first imaginary lines decrease, as the first imaginary lines approach the reference line; and second angles between second respective reference axes, each parallel to the reference line, and the plurality of second imaginary lines decrease, as the second imaginary lines approach the reference line.

3. The display panel as claimed in claim 2, wherein the first angles decrease by a first value and the second angles decrease by a second value, the first value and the second value are the same or different.

4. The display panel as claimed in claim 3, wherein, when an angle between a first reference axis of the first respective reference axes and a first outermost line among the plurality of first imaginary lines relative to the reference line is $\theta_{11}$, an angle $\theta_{1n}$ between a first imaginary line parallel to an n-th pad of the first pad group and an n-th reference axis of the first respective reference axes satisfies the following equation:

$$\theta_{1n}=\theta_{11}-(n-1)\alpha,$$

where in $\theta_{1n}$, the subscript "1" indicates the first pad group and the subscript "n" indicates the n-th pad in the first pad group, n is an integer greater than or equal to 2, and α is the first value.

5. The display panel as claimed in claim 4, wherein, when an angle between a first reference axis of the second respective reference axes and a second outermost line located at the outermost among the plurality of second imaginary lines relative to the reference line is $\theta_{21}$, an angle between a second imaginary line parallel to an m-th pad of the second pad group and an m-th reference axis of the second respective reference axes satisfies the following equation:

$$\theta_{2m}=\theta_{21}-(m-1)\beta,$$

where in $\theta_{2m}$, the subscript "2" indicates the second pad group and the subscript "m" indicates the m-th pad in the second pad group m is an integer greater than or equal to 2 and a number of the second pads, and β is the second value.

6. The display panel as claimed in claim 5, wherein, when $\theta_{21}<\theta_{11}$, $\theta_{21}$ satisfies the following equation:

$$\theta_{21}\neq\theta_{11}-n\times\alpha.$$

7. The display panel as claimed in claim 1, wherein the first point and the second point are located at different positions on the reference line.

8. The display panel as claimed in claim 1, wherein one of the first point and the second point is located on the reference line and the other is located outside the reference line.

9. The display panel as claimed in claim 2, wherein:

the first pads and the second pads are spaced apart from each other along a first direction, the reference line is parallel to a second direction perpendicular to the first direction, and the pad region further comprises a third pad group and a fourth pad group symmetric to the first pad group and the second pad group, respectively, with respect to the reference line.

10. The display panel as claimed in claim 9, wherein each of the first pads and the second pads has a parallelogram form having two first sides parallel to the first direction and two second sides tilted with respect to the reference line, an interval between two adjacent pads in the first direction being non-constant.

11. An electronic device, comprising:

a first electronic component and a second electronic component electrically connected to each other, each of the first electronic component and the second electronic component including a pad region, and each pad region having a first pad group and a second pad group adjacent to each other in a first direction, and wherein one of the first pad group and the second pad group is disposed between the other one of the first pad group and the second pad group and a reference line extending along a second direction perpendicular to the first direction, wherein the first pad group includes a plurality of first pads extending along a plurality of first imaginary lines, and the plurality of the first pads are arrayed continuously in the first direction, wherein the second pad group includes a plurality of second pads extending along a plurality of second imaginary lines, and the plurality of the second pads are arrayed continuously in the first direction, wherein the plurality of the first pads and the plurality of the second pads are arrayed in the first direction, wherein the plurality of first imaginary lines substantially converges into a first point and the plurality of second imaginary lines substantially converges into a second point, wherein the plurality of the first imaginary lines and the plurality of the second imaginary lines cross the second direction, and wherein the first and second points are located at different positions.

12. The electronic device as claimed in claim 11, wherein the first pad group and the second pad group are arrayed in the first direction, first angles between first respective reference axes, each parallel to the reference line, and the plurality of first imaginary lines decrease, as the first imaginary lines approach the reference line; and second angles between second respective reference axes, each parallel to the reference line, and the plurality of second imaginary lines decrease, as the second imaginary lines approach the reference line.

13. The electronic device as claimed in claim 12, wherein the first angles decrease by a first value and the second angles decrease by a second value, the first value and the second value are the same or different.

14. The electronic device as claimed in claim 13, wherein, when an angle between a first reference axis of the first respective reference axes and a first outermost line among the plurality of first imaginary lines relative to the reference line is $\theta_{11}$, an angle $\theta_{1n}$ between a first imaginary line parallel to an n-th pad of the first pad group and a n-th reference axis of the first respective reference axes satisfies the following equation:

$$\theta_{1n}=\theta_{11}-(n-1)\alpha,$$

where in $\theta_{1n}$, the subscript "1" indicates the first pad group and the subscript "n" indicates the n-th pad in the first pad group, n is an integer greater than or equal to 2, and $\alpha$ is the first value.

15. The electronic device as claimed in claim 14, wherein, when an angle between a first reference axis of the second respective reference axes and a second outermost line located at the outermost among the plurality of second imaginary lines relative to the reference line is $\theta_{21}$, an angle between a second imaginary line parallel to an m-th pad of the second pad group and an m-th reference axis of the second respective reference axes satisfies the following equation:

$$\theta_{2m}=\theta_{21}-(m-1)\beta,$$

where in $\theta_{2m}$, the subscript "2" indicates the second pad group and the subscript "m" indicates the m-th pad in the second pad group m is an integer greater than or equal to 2 and a number of the first pads, and $\beta$ is the second value.

16. The electronic device as claimed in claim 15, wherein, when $\theta_{21}<\theta_{11}$, $\theta_{21}$ satisfies the following equation:

$$\theta_{21}\neq\theta_{11}-n\times\alpha.$$

17. The electronic device as claimed in claim 11, wherein the first electronic component is an electro-optical panel, and the second electronic component is a flexible wiring substrate supplying a drive signal to the electro-optical panel.

18. The electronic device as claimed in claim 17, wherein the first point and the second point are located on the electro-optical panel.

19. The electronic device as claimed in claim 17, wherein the first point and the second point are located on the flexible wiring substrate.

20. A method of bonding a first electronic component and a second electronic component of an electronic device, the first electronic component and the second electronic component being electrically coupled to each other, each of the first electronic component and the second electronic component including a pad region, and each pad region having a first pad group and a second pad group adjacent to each other in the first direction, the method comprising:

performing primary alignment of the first electronic component and the second electronic components, such that the first electronic component and the second component face each other;

calculating a first x-axis displacement value of the first electronic component and a second x-axis displacement value of the second electronic component;

determining whether the first and second x-axis displacement values are different from each other;

when the first and second x-axis displacement values are the same, proceeding to bonding the first electronic component and the second electronic component, and when the first and second x-axis displacement values are different, calculating a y-axis correction value on the basis of a deviation between the first and second x-axis displacement values; and correcting the first and second electronic components by a y-axis on the basis of the calculated y-axis correction value, wherein the first pad group includes a plurality of first pads extending along a plurality of first imaginary lines, the second pad group includes a plurality of second pads extending along a plurality of second imaginary lines, wherein the plurality of the first pads and the plurality of the second pads are arrayed in the first direction, wherein the plurality of the first imaginary lines and the plurality of the second imaginary lines cross the first direction, wherein one pad group of the first pad group and the second pad group is disposed between the other one pad group of the first pad group and the second pad group and the reference line in the first direction, wherein the plurality of first imaginary lines substantially converges into a first point and the plurality of second imaginary lines substantially converges into a second point, and wherein the first point and the second point are located at different positions.

* * * * *